(12) United States Patent
Ogi et al.

(10) Patent No.: US 8,864,934 B2
(45) Date of Patent: Oct. 21, 2014

(54) PLASMA PROCESSING APPARATUS, PLASMA PROCESSING METHOD, AND STORAGE MEDIUM

(75) Inventors: Tatsuya Ogi, Miyagi (JP); Wataru Ozawa, Miyagi (JP); Kimihiro Fukasawa, Miyagi (JP); Kazuhiro Kanaya, Miyagi (JP)

(73) Assignee: Tokyo Electron Limited (JP)

( * ) Notice: Subject to any disclaimer, the term of this patent is extended or adjusted under 35 U.S.C. 154(b) by 154 days.

(21) Appl. No.: 13/434,284

(22) Filed: Mar. 29, 2012

(65) Prior Publication Data

US 2012/0248067 A1 Oct. 4, 2012

Related U.S. Application Data

(60) Provisional application No. 61/477,182, filed on Apr. 20, 2011.

(30) Foreign Application Priority Data

Mar. 31, 2011 (JP) ................................ 2011-080133

(51) Int. Cl.
*C23F 1/00* (2006.01)
(52) U.S. Cl.
USPC ............ 156/345.27; 156/345.47; 156/345.52; 118/725
(58) Field of Classification Search
USPC ............ 156/345.27, 345.34, 345.36, 345.35, 156/345.37, 345.44, 345.47, 345.52; 118/723 I, 724, 725

See application file for complete search history.

(56) References Cited

U.S. PATENT DOCUMENTS

| | | | |
|---|---|---|---|
| 2009/0081878 A1* | 3/2009 | Dhindsa | 438/729 |
| 2010/0151687 A1* | 6/2010 | Dhindsa et al. | 438/710 |
| 2012/0048467 A1* | 3/2012 | Mahadeswaraswamy et al. | 156/345.27 |

FOREIGN PATENT DOCUMENTS

| | | |
|---|---|---|
| JP | 2011-003712 | 1/2011 |
| JP | 2011-009342 | 1/2011 |

* cited by examiner

*Primary Examiner* — Lan Vinh
(74) *Attorney, Agent, or Firm* — Cantor Colburn LLP

(57) ABSTRACT

Provided is a parallel flat-panel type plasma processing apparatus which includes a recipe storing unit storing a processing recipe for performing a plasma processing, a compensation setting unit setting an accumulation time of the plasma processing or the number of processed substrates after starting using a new second electrode and the compensation value of the set temperature of the second electrode in an input screen, and a storage unit storing the compensated set value. The plasma processing apparatus is further equipped with a program for controlling a temperature adjusting mechanism based on a set temperature after compensation by adding a set temperature of an upper electrode written in the processing recipe to the compensation value stored within the storage unit. As a result, the non-uniformity in the plasma processing between the substrates caused by the change of processing atmosphere is suppressed.

5 Claims, 13 Drawing Sheets

FIG.3

| | SET ITEM | UNIT | SET VALUE |
|---|---|---|---|
| STEP 1 | PROCESS TIME | SEC. | a1 |
| | HIGH-FREQUENCY POWER RF1 | W | a2 |
| | HIGH-FREQUENCY POWER RF2 | W | a3 |
| | PROCESSING GAS G1 | sccm | a4 |
| | PROCESSING GAS G2 | sccm | a5 |
| | PROCESS PRESSURE | mTorr | a6 |
| | TEMPERATURE OF UPPER ELECTRODE | °C | a7 |
| STEP 2 | PROCESS TIME | SEC. | b1 |
| | HIGH-FREQUENCY POWER RF1 | W | b2 |
| | HIGH-FREQUENCY POWER RF2 | W | b3 |
| | PROCESSING GAS G1 | sccm | b4 |
| | PROCESSING GAS G2 | sccm | b5 |
| | PROCESS PRESSURE | mTorr | b6 |
| | TEMPERATURE OF UPPER ELECTRODE | °C | b7 |
| STEP 3 | PROCESS TIME | | |
| | HIGH-FREQUENCY POWER RF1 | | |
| | HIGH-FREQUENCY POWER RF2 | | |
| | ⋮ | ⋮ | ⋮ |

FIG. 4

| SET ITEM | UNIT | STEP NO. | FIRST SHEET | SECOND SHEET | THIRD SHEET | FOURTH-SIXTH SHEET | ... |
|---|---|---|---|---|---|---|---|
| PROCESS TIME | SEC. | S4 | +3 | +2 | +2 | +2 | ... |
| PROCESS TIME | SEC. | S6 | +3 | +2 | +2 | +2 | ... |
| HIGH-FREQUENCY POWER RF1 | W | S5 | +10 | +5 | +5 | +5 | ... |
| HIGH-FREQUENCY POWER RF2 | W | S5 | −6 | −4 | −4 | −4 | ... |
| PROCESSING GAS G1 | sccm | S4 | +6 | +6 | +6 | +7 | ... |
| PROCESSING GAS G1 | sccm | S5 | +7 | +7 | +7 | +7 | ... |
| PROCESS PRESSURE | mTorr | S4 | +4 | --- | --- | --- | ... |
| PROCESS PRESSURE | mTorr | S5 | +4 | --- | --- | --- | ... |
| TEMPERATURE OF UPPER ELECTRODE | °C | ALL STEPS | ( ) | ( ) | ( ) | ( ) | ... |

FIG. 14

| SET ITEM | UNIT | STEP NO. | 1~100-TH SHEET | 101~200-TH SHEET | 201~300-TH SHEET | 301~400-TH SHEET | 401~500-TH SHEET | ... |
|---|---|---|---|---|---|---|---|---|
| PROCESS TIME | SEC. | S4 | +5 | +4 | +3 | +3 | +3 | ... |
| PROCESS TIME | SEC. | S5 | +6 | +4 | +3 | +3 | +3 | ... |
| HIGH-FREQUENCY POWER RF1 | W | S5 | +20 | +10 | +10 | +10 | +10 | ... |
| HIGH-FREQUENCY POWER RF2 | W | S5 | −20 | −10 | −10 | −10 | −10 | ... |
| PROCESSING GAS G1 | sccm | S4 | +10 | +6 | +5 | +5 | +5 | ... |
| PROCESSING GAS G1 | sccm | S5 | +10 | +5 | +5 | +5 | +5 | ... |
| PROCESS PRESSURE | mTorr | S4 | +10 | +5 | +5 | +5 | +5 | ... |
| PROCESS PRESSURE | mTorr | S5 | +10 | +5 | +5 | +5 | +5 | ... |

PLASMA PROCESSING APPARATUS, PLASMA PROCESSING METHOD, AND STORAGE MEDIUM

CROSS-REFERENCE TO RELATED APPLICATIONS

This application is based on and claims priority from Japanese Patent Application No. 2011-080133, filed on Mar. 31, 2011, with the Japanese Patent Office, the disclosure of which is incorporated herein in its entirety by reference. Also, this application claims the benefit of U.S. Provisional Application No. 61/477,182 filed on Apr. 20, 2011, with the United States Patent and Trademark Office, the disclosure of which is incorporated herein in its entirety by reference.

TECHNICAL FIELD

The present disclosure relates to a parallel flat-panel type plasma processing apparatus.

BACKGROUND

A parallel flat-panel type plasma processing apparatus used in a semiconductor fabrication process is configured in such a manner that a substrate placing table serving as a lower electrode and an upper electrode are placed opposite to each other within a vacuum chamber, and high-frequency power is applied between both the electrodes to convert a processing gas into plasma. Since a gas supply unit is generally configured as a gas shower head that ejects processing gas in a shower type, the upper electrode is configured by an electrode plate positioned in a lowest part of the gas shower head.

In this apparatus, the temperature of a substrate is determined by heat dissipation to the placing table, heat absorption from plasma, and radiation heat from the upper electrode, but the temperature of the upper electrode is set to a temperature which is considered to be appropriate with respect to some processes. It is difficult to install a temperature detecting unit in the upper electrode and a neighboring region thereof because a high-frequency power flows on the upper electrode and the neighboring region thereof. As a result, for example, a value of power supplied to a heater for heating the upper electrodes, which is placed above the gas shower head, is set to an appropriate value in advance.

Meanwhile, as the plasma processing apparatus is actuated, a processing environment is changed. As a detailed example, in a plasma etching apparatus, a reaction product in etching may be adhered to a member. When the reaction product is adhered, several changes occur. For example, a change in a surface state of a ring member (a focus ring) for adjusting a state of plasma, which is placed to surround a substrate placing area in the placing table, a change in diameter of a gas supply hole of the gas shower head, and a change in state of an inner wall surface of the vacuum chamber occur, such that a processing result or a processing speed is changed. Further, according to a verification test of the present inventors, the upper electrode is exposed to plasma, and as a result, a plate thickness may decrease.

In view of operating the apparatus, maintenance of cleaning the inside of the vacuum chamber by periodically converting cleaning gas into plasma or replacing members with new ones is performed. However, an atmosphere of the processing environment is changed between a state of a so called initialization moment and a moment of operating the apparatus thereafter, and as a result, a processing state between substrates is not constant. When the lot of substrates is changed, even between an initial replacement time of the lot and a time when the number of processed sheets of substrates thereafter increases, the environment atmosphere is also changed to influence processing uniformity among the substrates.

Japanese Patent Application Laid-Open No. 2011-3712 discloses a technology of adjusting the parameters of a processing recipe by sequentially measuring a processing result of the substrate and feeding back the measurement result, and managing an update of a feed-back value by using an accumulation time of applying high-frequency power or an elapsed time after initialization of the apparatus. However, this technique needs an expensive measurement device and deterioration in a throughput based on a time required to measure the processing result is inevitable.

Japanese Patent Application Laid-Open No. 2011-9342 discloses a technology of operating a substrate processing apparatus of connecting a plurality of process modules (PMs) that perform plasma processing such as dry etching to the vicinity of a transfer module that transports a substrate in vacuum. According to Japanese Patent Application Laid-Open No. 2011-3712, when a control job (CJ) which is first activated in any PM does not have a process job (PJ) which is executable in a corresponding PM, the CJ first belongs to another CJ and execution of the PJ which is executable in the corresponding PM is permitted. As a result, an atmosphere within the corresponding PM is prevented from being significantly changed whenever the PJ is executed. However, Japanese Patent Application Laid-Open No. 2011-9342 does not disclose a technology of reducing the influence of the processing environment which is changed as the apparatus is actuated.

SUMMARY

An exemplary embodiment of the present disclosure provides a parallel flat-panel type plasma processing apparatus including: a processing chamber provided with a first electrode and a second electrode where a placing table serves as the first electrode configured to place a substrate, and a high-frequency power is applied between the first and second electrodes to convert a processing gas into plasma thereby performing a plasma processing for the substrate; a temperature adjusting mechanism configured to adjust a temperature of the second electrode; a temperature setting unit configured to set the temperature of the second electrode in the plasma processing; a set temperature compensating unit configured to compensate the set temperature of the second electrode to become lower than an initial temperature with a used time elapsed after starting using a new second electrode; and a temperature controlling unit configured to output a control signal for controlling the temperature adjusting mechanism based on the set temperature of the second electrode.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is an explanatory diagram illustrating an example of a processing parameter set as a recipe used when plasma etching apparatus is actuated.

FIG. 4 is a compensation value table for compensating the processing parameter.

FIG. 14 is a compensation value table for compensating a processing parameter between lots by using the plasma etching apparatus according to the second exemplary embodiment.

DETAILED DESCRIPTION

Figure 1:
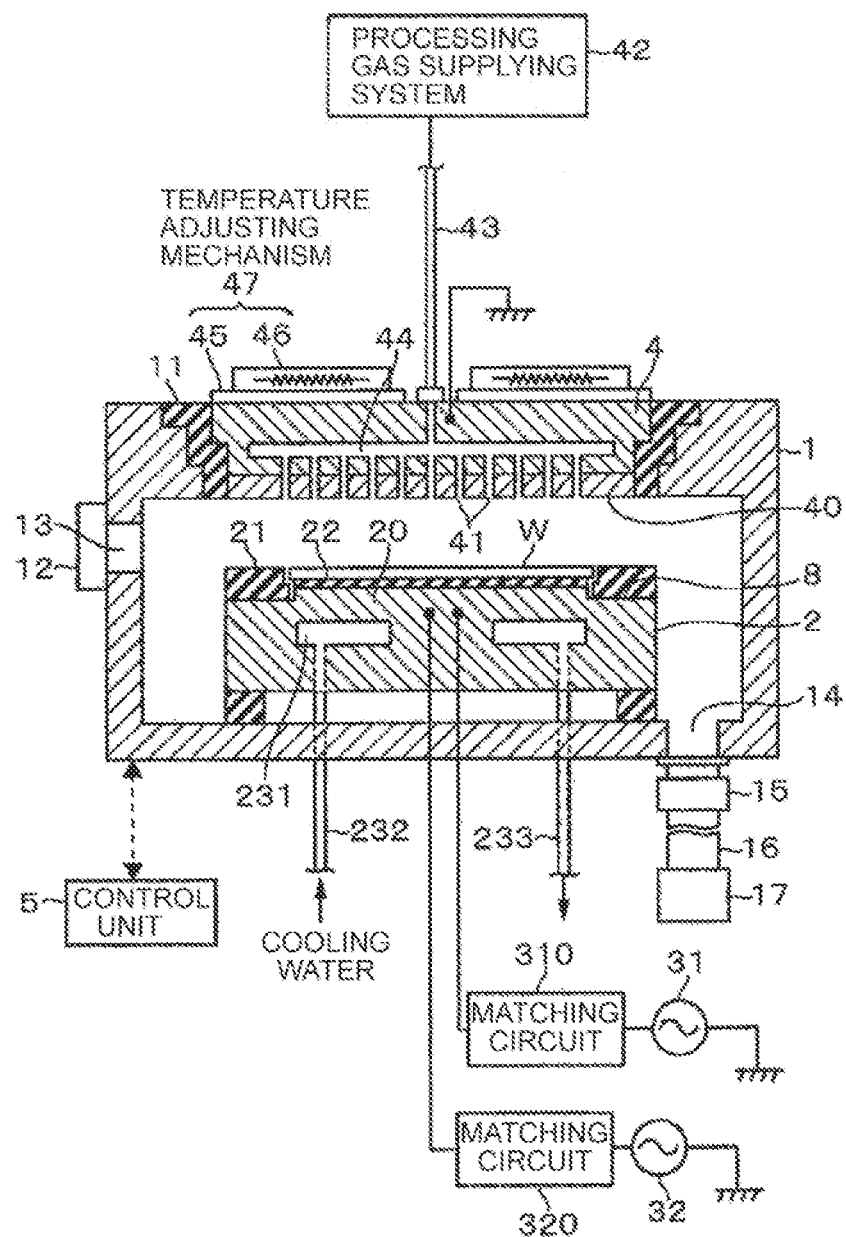
FIG. 1 is a longitudinal side view illustrating the configuration of a plasma etching apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a technology that can suppress the processing uniformity among substrates from being deteriorated due to a change in atmosphere of a processing environment by using an apparatus in a parallel flat-panel type (capacitively coupled) plasma processing apparatus.

An exemplary embodiment of the present disclosure provides a parallel flat-panel type plasma processing apparatus including: a processing chamber provided with a first electrode and a second electrode where a placing table serves as the first electrode configured to place a substrate, and a high-frequency power is applied between the first and second electrodes to convert a processing gas into plasma thereby performing a plasma processing for the substrate; a temperature adjusting mechanism configured to adjust a temperature of the second electrode; a temperature setting unit configured to set the temperature of the second electrode in the plasma processing; a set temperature compensating unit configured to compensate the set temperature of the second electrode to become lower than an initial temperature with a used time elapsed after starting using a new second electrode; and a temperature controlling unit configured to output a control signal for controlling the temperature adjusting mechanism based on the set temperature of the second electrode.

An example of the expression 'with a used time of the second electrode elapsed' may include, for example, the accumulation time of the plasma processing after starting using a new second electrode or the number of processed substrates.

The set temperature compensating unit includes a storage unit configured to store compensation data acquired by associating a compensation value of the set temperature of the second electrode with an accumulation time of the plasma processing or the number of processed substrates after starting using a new second electrode, and is configured to read the compensation value of the set temperature depending on the accumulation time of the plasma processing or the number of processed substrates from the storage unit to compensate the set temperature set in the temperature setting unit. The set temperature compensating unit includes an input screen for inputting the compensation value of the set temperature of the second electrode with the accumulation time of the plasma processing or the number of processed substrates after starting using a second electrode.

Another exemplary embodiment of the present disclosure provides a plasma processing method using a parallel flat-panel type plasma processing apparatus having a processing chamber provided with a first electrode and a second electrode where a placing table serves as the first electrode configured to place a substrate, and a high-frequency power is applied between the first and second electrodes to convert a processing gas into plasma thereby performing a plasma processing for the substrate, the method including: setting the temperature of the second electrode in the plasma processing; compensating the set temperature of the second electrode set in the setting process to become lower than an initial temperature with a used time elapsed after starting using a new second electrode; and controlling a temperature adjusting mechanism for adjusting the temperature of the second electrode based on the set temperature of the second electrode compensated in the compensating process.

The compensating the set temperature of the second electrode is performed based on compensation data acquired by associating a compensation value of the set temperature of the second electrode with an accumulation time of the plasma processing or the number of processed substrates after starting using a new second electrode.

A non-transitory computer-readable recording medium storing a computer program that, when executed, causes a computer to control a parallel flat-panel type plasma processing apparatus having a processing chamber provided with a first electrode and a second electrode where a placing table serves as the first electrode configured to place a substrate, and a high-frequency power is applied between the first and second electrodes to convert a processing gas into plasma thereby performing a plasma processing for the substrate, thereby performing a plasma processing method, including: setting the temperature of the second electrode in the plasma processing; compensating the set temperature of the second electrode set in the setting process to become lower than an initial temperature with a used time elapsed after starting using a new second electrode; and controlling a temperature adjusting mechanism for adjusting the temperature of the second electrode based on the set temperature of the second electrode compensated in the compensating process.

According to exemplary embodiments of the present disclosure, in a parallel flat-panel type (capacitively coupled) plasma processing apparatus where a first electrode serving as a placing table of a substrate and a second electrode opposite thereto are installed, a set temperature of the second electrode is compensated to be low with a used time of the second electrode elapsed after starting using a new second electrode by considering a phenomenon in which the thickness decreases due to the use of the second electrode to increase the temperature of the corresponding second electrode. Accordingly, a change in temperature of the second electrode caused by the use of the second electrode can be suppressed and variation in processing among substrates caused by the temperature change of the second electrode can be reduced.

First Exemplary Embodiment

FIG. 1 illustrates an exemplary embodiment in which a plasma processing apparatus of the present disclosure is applied to a plasma etching apparatus. Reference numeral 1 represents an airtight vacuum chamber (processing chamber) made of, for example, aluminum. A placing table 2 is installed at the center of the bottom of vacuum chamber 1. Placing table 2 is configured to have a shape in which the periphery of the top of a cylinder is notched throughout the entirety of a circumference thereof and a step portion 8 is formed, that is, a shape in which a part other than the periphery protrudes cylindrically on the top. The protruded portion forms a placing part 20 where a semiconductor wafer (a 'wafer') W as a substrate is placed and a focus ring 21 for adjusting a state of plasma is placed in step portion 8 surrounding placing part 20.

An electrostatic chuck 22 formed by placing a chuck electrode (not shown) on an insulating layer is installed on the top of placing part 20, and adsorption/releasing of wafer W may be switched by supplying/stopping power from a DC power supply (not shown). A plurality of ejection openings (not shown) are formed in electrostatic chuck 22, and heat transfer gas such as He gas that performs heat transfer between electrostatic chuck 22 and wafer W is supplied from the ejection openings.

A refrigerant passage 231 is formed in placing table 2, and a refrigerant is configured to circulate through a path of a refrigerant supply path 232, refrigerant passage 231 and a refrigerant discharge path 233 in this order. The refrigerant discharged from refrigerant discharge path 233 is cooled up to a predetermined temperature set value by a chiller to return from refrigerant supply path 232 to refrigerant passage 231. As a result, placing table 2 is maintained to a predetermined reference temperature by the refrigerant, and the temperature of wafer W is determined by a balance between heat absorption from plasma and heat dissipated to placing table 2 through the heat transfer gas.

Placing table 2 also serves a lower electrode (first electrode) of a plasma etching apparatus, and a first high-frequency power supply unit 31 for generating plasma and a second high-frequency power supply unit 32 for applying bias power for injecting ions in plasma are connected to placing table 2 through matching circuits 310 and 320, respectively.

An elevation pin (not shown) is installed in placing table 2, and wafer W may be transferred between a transportation arm (not shown) which is installed outside the corresponding apparatus and the top (electrostatic chuck 21) of placing table 2.

A shower head 4 which is a gas supply unit for supplying processing gas into vacuum chamber 1 is installed on a ceiling of vacuum chamber 1 to be opposite to placing part 20 through insulating member 11. A plurality of ejection openings 41 are formed on the bottom of shower head 4, and predetermined processing gas is supplied into vacuum chamber 1 from a processing gas supplying system 42 installed outside vacuum chamber 1 through a gas supply path 43, a buffer chamber 44 and corresponding ejection opening 41.

Gas shower head 4 is grounded, and a parallel flat-panel is formed between gas shower head 4 and placing table 2 as the lower electrode in a lowest part thereof, such that an upper electrode (second electrode) 40 for converting the processing gas into plasma is installed. Since upper electrode 40 is exposed to a space where plasma is generated, upper electrode 40 is consumed with a use time elapsed by contacting plasma. Therefore, upper electrode 40 is configured by an electrode plate which is arbitrarily replaced. Ejection openings 41 are opened toward the inside of vacuum chamber 1 on the bottom of upper electrode 40.

A temperature adjusting mechanism 47 that adjusts the temperature of upper electrode 40 is installed on the top of shower head 4. Temperature adjusting mechanism 47 is constituted by a cooler 45 including a cooling path through which a Peltier element or a cooling medium circulates and a heater 46 as a heating unit configured by a heat emitting resistor, and has a function to adjust upper electrode 40 to a desired temperature according to a process situation or a chamber situation (a situation of each apparatus installed in vacuum chamber 1) by a combined action of both sides.

A carry-in outlet 13 of wafer W which is openable/closable by a shutter 12 is installed on a side wall of vacuum chamber 1. An exhaust port 14 is installed on the bottom of vacuum chamber 1, and a vacuum pump 17 is connected to exhaust port 14 through an exhaust pipe 16 where a pressure adjusting unit 15 such as a valve is installed.

Figure 2:
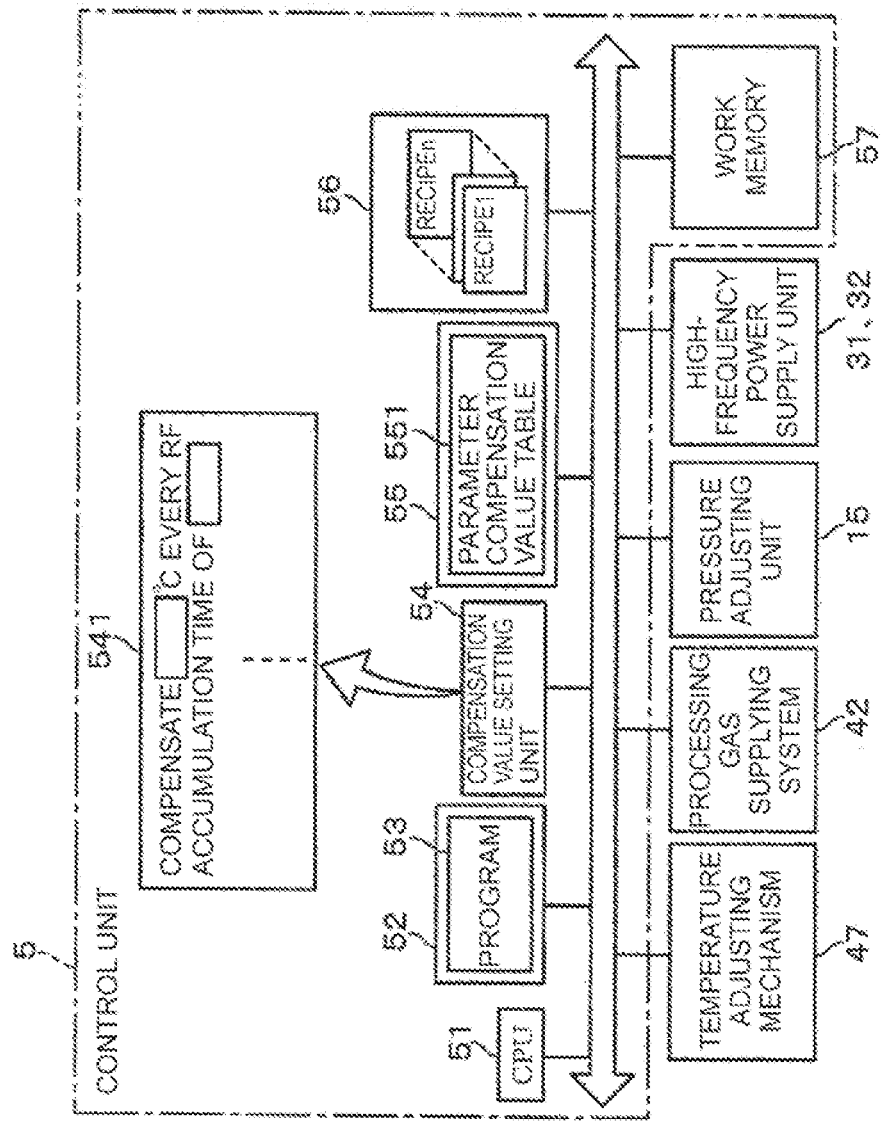
FIG. 2 is a block diagram illustrating an electrical configuration of the plasma etching apparatus.

The aforementioned plasma etching apparatus is connected to a control unit 5 as shown in FIG. 1 and FIG. 2. As shown in a block diagram of FIG. 2, control unit 5 is configured by a computer including, for example, a central processing unit (CPU) 51 and a program storing unit 52, and is connected with processing gas supplying system 42, high-frequency power supply units 31, 32, or pressure adjusting unit 15.

In program storing unit 52, a program is recorded, in which a step (command) group regarding the operation of the plasma etching apparatus, that is, a control until wafer W is carried into vacuum chamber 1 and vacuum-exhausted, and the processing gas supplied into vacuum chamber 1 is converted into plasma to etch wafer W, and thereafter, wafer W is carried out, is embedded. The program is stored in, for example, a memory medium such as a hard disk, a compact disk, a magnet optical disk and a memory card, and installed in the computer therefrom.

In the plasma etching apparatus having the aforementioned configuration, as described as a background art, a phenomenon in which a processing environment is changed as the plasma etching apparatus is actuated may be seen. In particular, the present inventors recognize that the etching speed of a film formed on the surface of wafer W gradually decreases with an operation time elapsed.

As a result of investigating a cause that generates the phenomenon, the present inventors have found out that, when upper electrode 40 is consumed by exposing to plasma within vacuum chamber 1, the temperature of corresponding upper electrode 40 increases, and the increased temperature reduces the etching speed of plasma.

It is understood that the consumption of upper electrode 40 causes a thermal capacity thereof to deteriorate, and as a result, the temperature of upper electrode 40 increases even though the temperature is adjusted by temperature adjusting mechanism 47 by setting the temperature set value to a constant value. It is estimated that a deposition component moves from upper electrode 40 to wafer W as the temperature of upper electrode 40 increases, such that a deposition property of activated species which contributes to etching increases thereby decreasing the etching speed.

In order to remedy the phenomenon, the plasma etching apparatus according to the present exemplary embodiment has a function to prevent the etching speed from decreasing by suppressing the increase of the temperature of upper electrode 40 through temperature adjusting mechanism 47 as the use time of upper electrode 40 elapsed. In particular, since upper electrode 40 constitutes a part of a high-frequency circuit and is a member which is difficult to measure the temperature by using a simple technique, such as a thermocouple, the temperature is controlled without measuring the actual temperature. Specifically, the relationship between an adjustment amount of temperature adjusting mechanism 47, for example, a power feeding amount to heater 46 or a flow of a cooling medium to cooler 45 and the temperature of upper electrode 40 is determined in advance, and temperature adjusting mechanism 47 is controlled based on the relationship and the set temperature. Hereinafter, details thereof will be described.

The plasma processing apparatus of the present exemplary embodiment includes control unit 5. Control unit 5 includes CPU 51, program storing unit 52 storing a program 53, a compensation value setting unit 54 for setting a compensation value of a parameter (processing parameter), a storage unit 55 storing a parameter compensation value table 551, a recipe storing unit 56 storing a processing recipe, and a work memory 57.

Program 53 includes a program for controlling reading the processing recipe from recipe storing unit 56 and controlling an apparatus to execute the content of the recipe and a program for compensating a parameter value recorded in the processing recipe by referring to parameter compensation value table 551, and is the general term for the programs.

Compensation value setting unit 54 receives an input of a compensation value of a parameter by an operator through an input screen 541 configured by a touch panel type liquid crystal display. As for the parameter, for example, the temperature of upper electrode 40, high-frequency power, processing pressure and processing time may be used as described below. As shown in FIG. 2 illustrating a configuration example of input screen 541, a compensation interval to compensate the temperature and a temperature compensation value of upper electrode 40 to be compensated for each of the compensation interval elapsed may be inputted into compensation value setting unit 54 according to the present exemplary embodiment. The compensation interval or the temperature compensation value inputted in compensation value setting unit 54 is stored in a rewritable memory.

The compensation interval and the temperature compensation value inputted into setting screen 541 may be determined by starting using a new upper electrode 40, and thereafter, determining a relationship between an application time of the high-frequency power to upper electrode 40 and a change in temperature or etching speed of upper electrode 40 by a preliminary experiment in advance, as shown in, for example, an experimental result described below.

Recipe storing unit 56 stores the processing recipe prepared by associating, with the parameter, a processing sequence executed when the film formed on the surface of wafer W to be processed is etched. For example, in the plasma etching apparatus according to the present exemplary embodiment, the processing gas or the processing parameter such as the pressure is switched to consecutively etch multilayers formed on wafer W, and a step for executing the consecutive etching is stored in the processing recipe.

FIG. 3 schematically illustrates a setting example of the processing parameter set for each recipe, and the temperature or processing time of upper electrode 40 is used as a setting item of the processing parameter. The processing parameter is set, for example, for each step corresponding to each of the multilayers to be etched within one recipe, and as a result, different types of layers may be consecutively etched.

Parameter compensation value table 551 is prepared as a table acquired by associating a timing of performing compensation with a compensation value for compensating a set value disclosed in FIG. 3 in regards to a setting item of which a set value needs to be changed, for example, with a time elapsed, among the processing parameters of the respective recipes. FIG. 4 illustrates an example of parameter correction value table 551 acquired by associating the compensation value of the parameter with the number of sheets of wafers within a corresponding lot when the number of accumulated lots of wafers W processed by the plasma etching apparatus is an N-th lot from a predetermined start moment. The compensation value disclosed in parameter compensation value table 551 as shown in FIG. 4 is just a numerical value for ease of description.

Parameter compensation value table 551 is prepared by inputting the compensation value of the processing parameter of the recipe by designating the step or wafer W with respect to the setting item as shown in FIG. 3 by using compensation value setting unit 54. By compensating the parameter value as described above, for example, a first wafer W of a corresponding lot is processed for a time that is 3 seconds longer than a process time set in the recipe, and a second wafer W is processed for a time that is 2 seconds longer than a set value of the same recipe in steps S4 and S5.

A compensation temperature calculated based on the aforementioned compensation interval or temperature compensation value with respect to upper electrode 40 may be set as the compensation value of the corresponding processing parameter (the temperature of upper electrode 40) in parameter compensation value table 551. In the present exemplary embodiment, the temperature compensation value of upper electrode 40 is not set in parameter compensation value table 551 and the temperature compensation value is set when the corresponding N-th lot is executed by a structure as described below.

The temperature compensation value of upper electrode 40 set in parameter compensation value table 551 is calculated as follows, for example. Control unit 5 includes a time counting unit (not shown) that counts and accumulates the time for which the high-frequency power is applied from first high-frequency power supply unit 31 for generating plasma, by using a moment at which the use of a new product as upper electrode 40 starts as a time count startpoint. Control unit 5 has a function to add the compensation interval and compare the accumulation value (an accumulation time of plasma processing) of the application time of the high-frequency power time counted in the time counting unit with the addition value. And, whenever the accumulation value of the application time is more than the addition value of the compensation interval, the compensation interval is added. For example, when the compensation interval of the temperature of upper electrode 40 is represented by $I_c$ sec and the accumulation value of the application time of the high-frequency power is represented by $T_a$ sec, control unit 5 stands by in such a state during a period of $nI_c$>Ta (n=1, 2, 3, . . . ) and when $T_a$>$nI_c$, 'n=n+1 is rewritten to repetitively perform a subsequent comparison operation.

Control unit 5 has a function to add the temperature compensation value whenever Ta>$nI_c$ and write the added temperature compensation value in parameter compensation value table 551 as the compensation value of the processing parameter regarding the temperature of upper electrode 40. Herein, when the temperature compensation value is −1.5° C. and the compensation value at n=1 is 0° C., the compensation value of the lot processed during a period in which the application time of the high-frequency power is $0 \leq T_a < I_c$ is 0° C., and the compensation value of the lot processed during a period of $I_c \leq T_a < 2I_c$ is −1.5° C. Therefore, the compensation values are sequentially added with the increase of the application time of the high-frequency power.

Control unit 5 has even a function to generate an execution recipe by adding each compensation value of the N-th lot compensation value table which is generated as above to each value of the processing parameter of the recipe performed as the lot.

In program 53, a program for controlling temperature adjusting mechanism 47 will be described. This program adds the compensation value written in parameter compensation value table 551 to the parameter value included in the recipe read from recipe storing unit 56 and writes the parameter value after compensation in, for example, work memory 57. In regards to the execution of the recipe, the parameter value after compensation within work memory 57 is read to control each unit of the apparatus. The set temperature of upper electrode 40 is included as the parameter value, and the program outputs a control signal for controlling temperature adjusting mechanism 47 based on the set temperature after compensation by the aforementioned configuration. In the temperature control of upper electrode 40, since a temperature detection value is not fed back, the compensation value of the set temperature set in compensation value setting unit 54 may be, for example, a value acquired by converting a compensated power feeding amount of the power feeding amount to heater 46 into the temperature. A relationship between an adjusted heat quantity in temperature adjusting mechanism 47 and the set temperature is stored in the storage unit (not shown) as data. And, the adjusted heat quantity, for example, the power feeding amount to heater 46, the flow of the cooling medium in cooler 45, or the power feeding amount when cooler 45 is configured by a Peltier element, is determined based on the data and the set temperature.

Herein, a correspondence between the respective units in the present exemplary embodiment and the constituent elements of the appended claims is described. Since the recipe in recipe storing unit 56 sets the temperature of upper electrode 40, the recipe corresponds to a temperature setting unit. Compensation value setting unit 54 and parameter compensation table 551 correspond to a set temperature compensating unit, and the program corresponds to a temperature controlling unit that outputs the control signal for controlling temperature adjusting mechanism 47 based on the set temperature.

Figure 5:
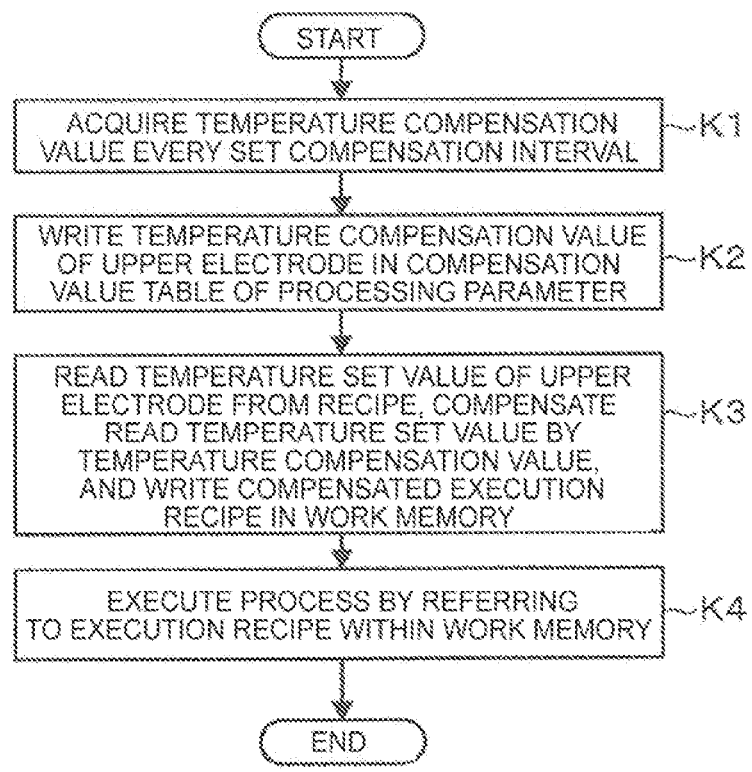
FIG. 5 is a flowchart illustrating the flow of an operation of the plasma etching apparatus.

Hereinafter, the operation of the plasma etching apparatus having the aforementioned configuration will be described with reference to a flowchart as shown in FIG. 5. First, in regard to the executed N-th lot, the accumulation value of the application time of the high-frequency power and the addition value of the compensation interval are compared with each other, and a unit temperature compensation value for each compensation interval is added to acuire the temperature compensation value (step K1).

Continuously, the temperature compensation value of upper electrode 40 is written in the compensation value table of the processing parameter (step K2), the temperature setting value of heater 46 is read from the recipe of recipe storing unit 56, the read temperature set value is compensated by the temperature compensation value of the compensation value table, and the compensated temperature set value is written in work memory 57 as the execution recipe (step K3).

Herein, as shown in FIG. 4, when the temperature of heater 46 is compensated, common temperature compensation is performed with respect to all wafers W within the same lot to suppress a sudden change in a generation state of plasma, thereby preventing processing results among wafers W within the same lot from being significantly different from each other.

Compensation based on the compensation value of the compensation value parameter is performed even with respect to another processing parameter within the corresponding recipe to be written in work memory 57 as the execution recipe.

Meanwhile, a transportation arm (not shown) holding wafer W enters vacuum chamber 1 from an external vacuum transportation chamber, and wafer W is transferred to placing table 2 through an elevation pin (not shown), and adsorption of wafer W is maintained by electrostatic chuck 22. Heat transfer gas is supplied to a gap between placing table 2 (electrostatic chuck 21) and wafer W.

An anti-reflection layer, an organic layer or a low-dielectric layer is laminated on the surface of wafer W, and pattern masks of a resist layer and a titanitride layer are formed on an uppermost surface.

Thereafter, the execution recipe is read from work memory 57, and power supply from first and second high-frequency power supply units 31 and 32, the supply of the processing gas from processing gas supplying system 42, vacuum exhaustion by vacuum pump 17, or pressure adjustment by pressure adjusting unit 15 is performed, such that plasma is generated in a processing atmosphere between lower electrode (placing table 2) and upper electrode 40.

Thin-film etching of the surface of wafer W is performed while ions in plasma are injected into wafer W by bias power. Thereafter, based on the processing parameter of the execution recipe, the processing gas or a supply amount thereof and the high-frequency power or process pressure are switched, and lower layers are etched in sequence.

In this case, even in regard to an output of heater 46 installed in upper electrode 40, the temperature adjustment is performed by temperature adjusting mechanism 47 based on the temperature set value after compensation read from the execution recipe within work memory 57 (step K4). That is, for example, a control for reducing the quantity of emitted heat of corresponding heater 46 is performed so as to offset the temperature increase caused by the consumption of upper electrode 40.

Figure 6:
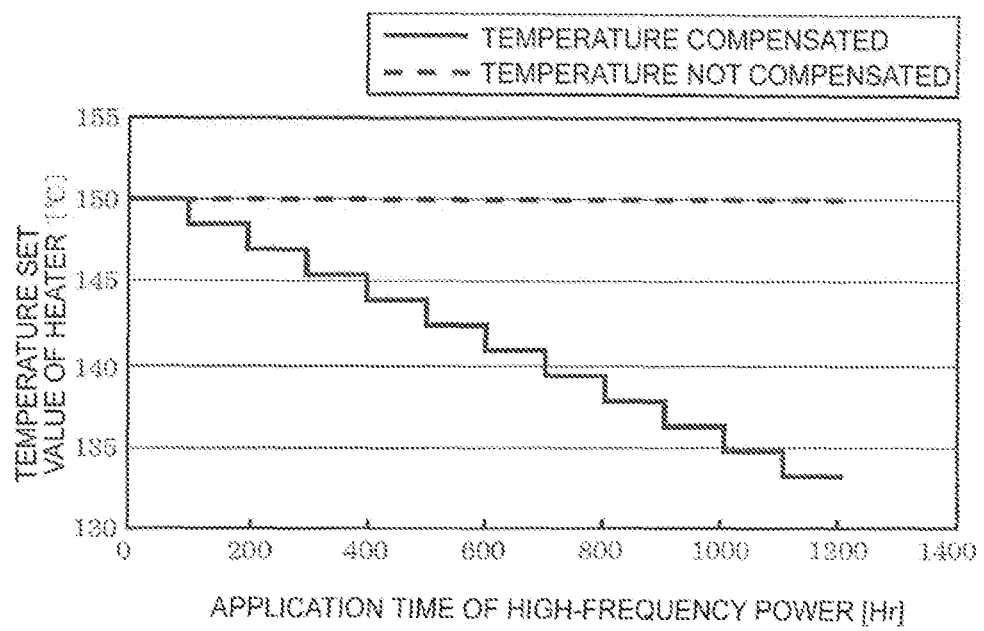
FIG. 6 is an explanatory diagram illustrating a temporal change in temperature set value of a heater installed in the plasma etching apparatus.
Figure 7:
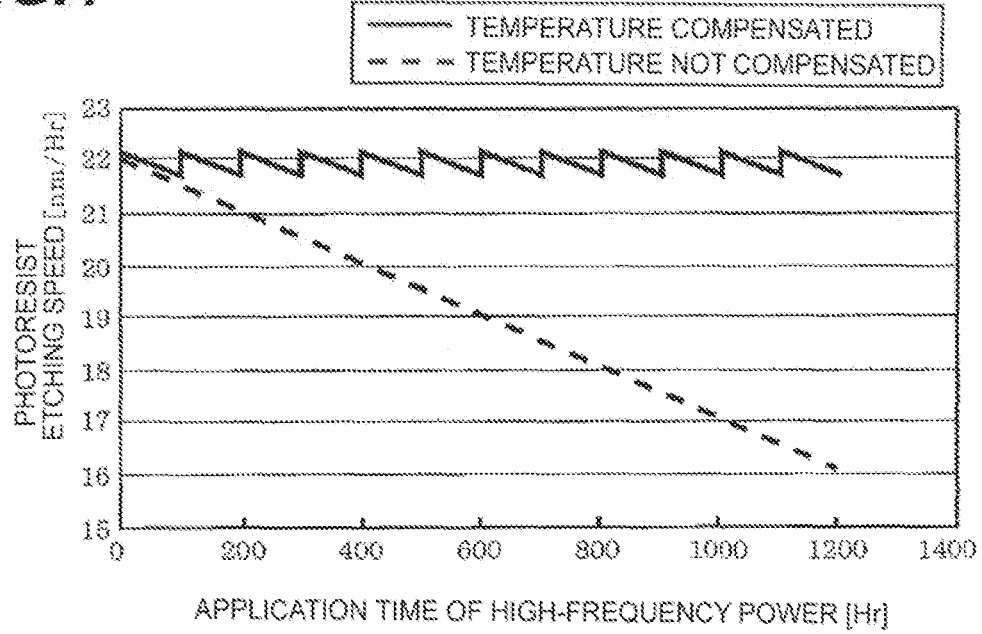
FIG. 7 is an explanatory diagram illustrating a temporal change in etching speed of a photoresist layer by the plasma etching apparatus.

Herein, in order to easily understand the exemplary embodiment, if the set temperature of upper electrode 40 is the same in each process recipe, the temperature set value of heater 46 decreases stepwise as shown by a solid line in FIG. 6, and the actual temperature of upper electrode 40 is maintained to a temperature within a substantially constant range. As a result, etching speed of various layers formed on the surface of wafer W varies within a constant range in a sawtooth shape according to a stepwise change in the temperature set value as shown by a solid line in FIG. 7. Herein, FIG. 7 schematically illustrates a state of an etching speed when a single layer configured by photoresist PR is etched. Dotted lines shown in FIG. 6 and FIG. 7 indicate the corresponding temperature set value and the etching speed of PR when the temperature set value of heater 46 is not compensated. Therefore, the layer is etched in an appropriate state even when the temperature set values of upper electrodes 40 are different from each other among the respective recipes or the respective steps within the recipe. However, a phenomenon in which appropriateness is deficient due to the temperature increase caused by the consumption of upper electrode 40 is suppressed by compensating the temperature set value.

By this configuration, when a lamination layer to be processed, which is formed on the surface of wafer W, is etched, the supply of the processing gas or the heat transfer gas stops and wafer W is carried out from vacuum chamber 1 in a reverse operation to the carry-in operation by cancelling a vacuum state within vacuum chamber 1 or adsorptively holding wafer W (end). Multiple wafers W may be etched by repeating the aforementioned operation with respect to wafer W that is carried into vacuum chamber 1.

According to the plasma etching apparatus of the present exemplary embodiment, the following effects are provided. As a parallel flat-panel type (capacitively coupled) plasma etching apparatus where lower electrode (first electrode) also serving as placing table 2 of wafer W and upper electrode (second electrode) 40 opposite thereto are installed, a set temperature of upper electrode 40 is compensated to become lower than an initial temperature with a used time of upper electrode 40 elapsed after starting using a new upper electrode 40, by considering a phenomenon in which the thickness decreases due to the use of the upper electrode 40 thereby increasing the temperature of the corresponding upper electrode 40. As a result, the phenomenon in which the temperature of upper electrode 40 increases caused by the consumption of upper electrode 40 is schematically offset, the temperature change in corresponding upper electrode 40 caused by the use of upper electrode 40 is suppressed, and variations in processing among wafers W caused by the temperature change of upper electrode 40 may be reduced.

The example of compensating the set temperature of upper electrode 40 with the accumulation time of plasma processing after starting using new upper electrode 40 has been described in the aforementioned exemplary embodiment, but a technique of measuring the elapsed time is not limited thereto. For example, the set temperature may be compensated with an increase in the number of processing sheets of wafers W after starting using new upper electrode 40.

[Evaluation Experiment in First Exemplary Embodiment]

By using the apparatus such as the plasma etching apparatus as shown in FIG. 1, a test operation was performed without compensating the temperature of upper electrode 40. In the test operation, a test wafer W was carried into vacuum chamber 1 at the same interval as an actual operation and a predetermined test process environment was formed, such that only predetermined sheets of test wafers W where the PR layer was formed on the surface thereof were processed. The etching speed was acquired with respect to the PR layer on the test wafer by measuring the layer thickness before and after the test process.

In regard to a condition of the test process, as processing gas, fluorocarbon gas, argon gas, and oxygen gas were used, pressure in vacuum chamber 1 was set to 30 [mTorr] (3.99 [Pa]), power supplied from first high-frequency power supply unit 31 for generating plasma and high-frequency power supply unit 32 for bias were set to 12.88 MHz, 4500 W and 40 Hz and 1200 W, and the process time was set to 600 sec.

Figure 8:
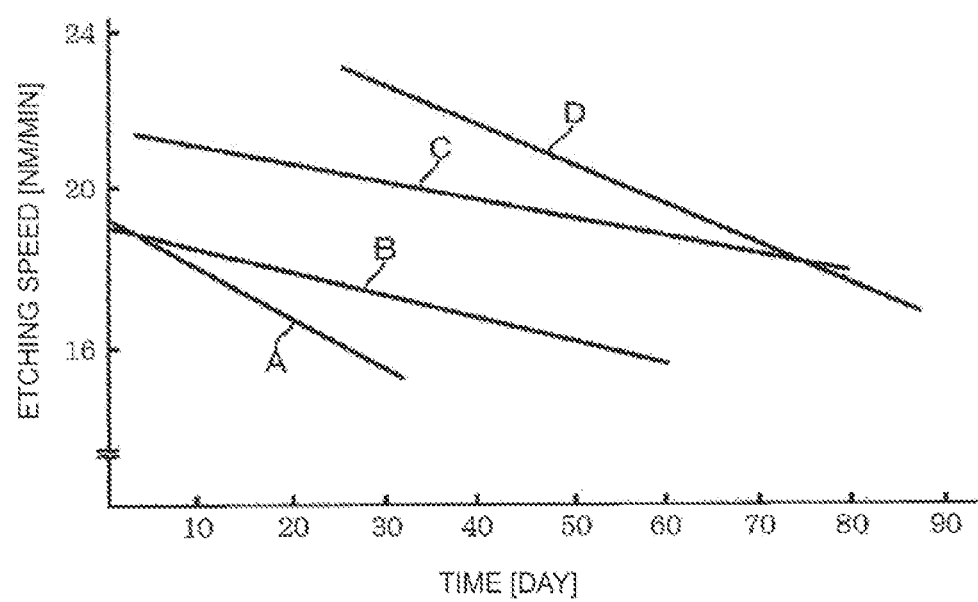
FIG. 8 is an explanatory diagram illustrating an experimental result for verifying the temporal change in etching speed of the photoresist layer.

The measurement values of an etching speed at each timing were plotted, and a straight line showing a tendency of the change in etching speed of the PR layer was extracted based on the plot group to acquire a result as shown in FIG. 8. In test results acquired by attaching reference numerals A to D of FIG. 8, vacuum chambers 1 which are tested are different from each other, and test start timings are different from each other. An additional running test was performed with respect to each vacuum chamber 1 until this test was performed, and based on a fact that a history of the running test was different for each vacuum chamber 1, it could be seen that a slope or a timing of the straight line is different, but the etching speed tends to decrease with the time elapsed even in regard to the test result of any one of A to D.

Based on the result, a level of contribution of a temporal change in the etching speed of the PR layer was analyzed together with abrasion of focus ring 21, and as a result, it was proved that the level of contribution of the temperature of upper electrode 40 is significantly large.

In the same vacuum chamber 1, upper electrode 40 that was used and consumed in the actual operation is replaced with upper electrode 40 as a new product to process five sheets of wafers W for each upper electrode 40. A test thermometer was installed at the center of upper electrode 40 and the temperature was monitored, and as a result, a result as shown in FIG. 9 could be acquired.

Figure 9:
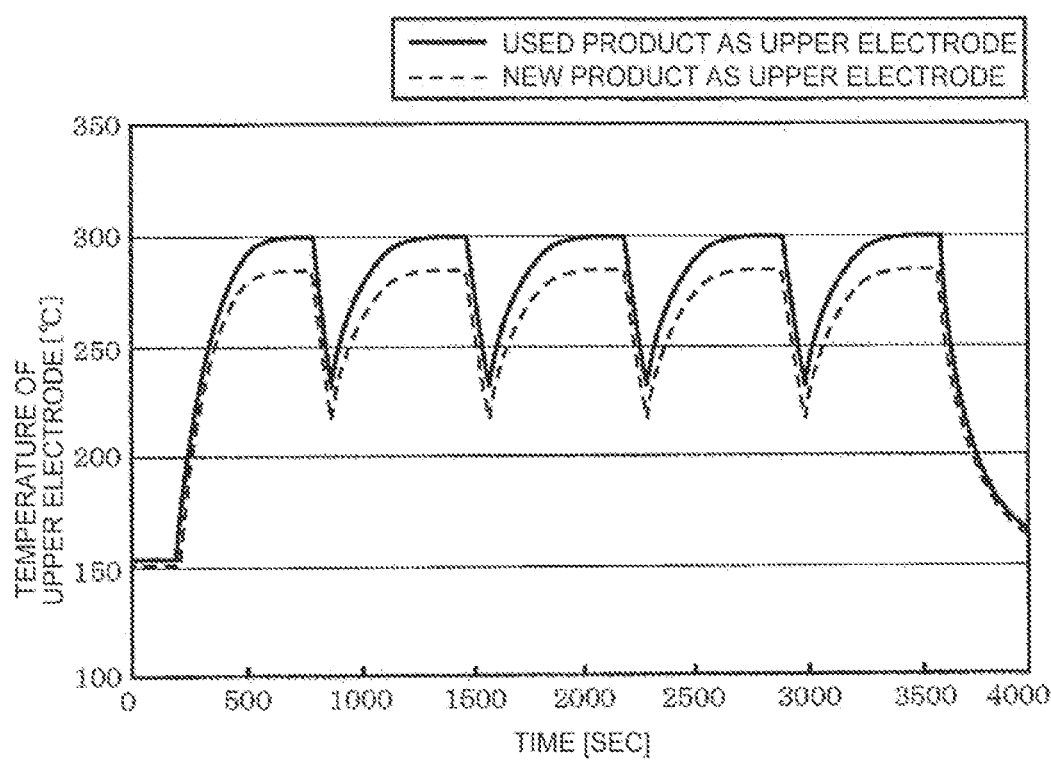
FIG. 9 is an explanatory diagram illustrating a change in temperature of an upper electrode when a wafer is processed by using the plasma etching apparatus.

According to the test result as shown in FIG. 9, when plasma etching of wafer W starts, the temperature of upper electrode 40 increases and when the etching ends, the temperature decreases. This regard was common in the case where upper electrode 40 is the new product (shown by the dotted line in FIG. 9) and the case where upper electrode 40 is the used product (shown by the solid line in FIG. 9).

Meanwhile, it could be seen that any one of a temperature which upper electrode 40 reaches during the plasma etching and a temperature after the plasma etching is the higher in the case where upper electrode 40 is the used product. From the test result, it is understood that the temperature increase of corresponding upper electrode 40 caused by the consumption of upper electrode 40 influences the phenomenon (FIG. 8) in which the etching speed decreases with respect the PR layer.

Therefore, the test as shown in FIG. 9 was performed by using upper electrode 40 as the new product and changing the temperature set value of heater 46 heating upper electrode 40. As a result, when the temperature set value of heater 46 was 150° C. (shown in the dotted line) and 180° C. (shown in the solid line), respectively, as shown in FIG. 10, it could be seen that the substantially same temperature difference as the temperature set value of heater 46 was generated in the temperature of upper electrode 40 in the plasma etching.

Figure 10:
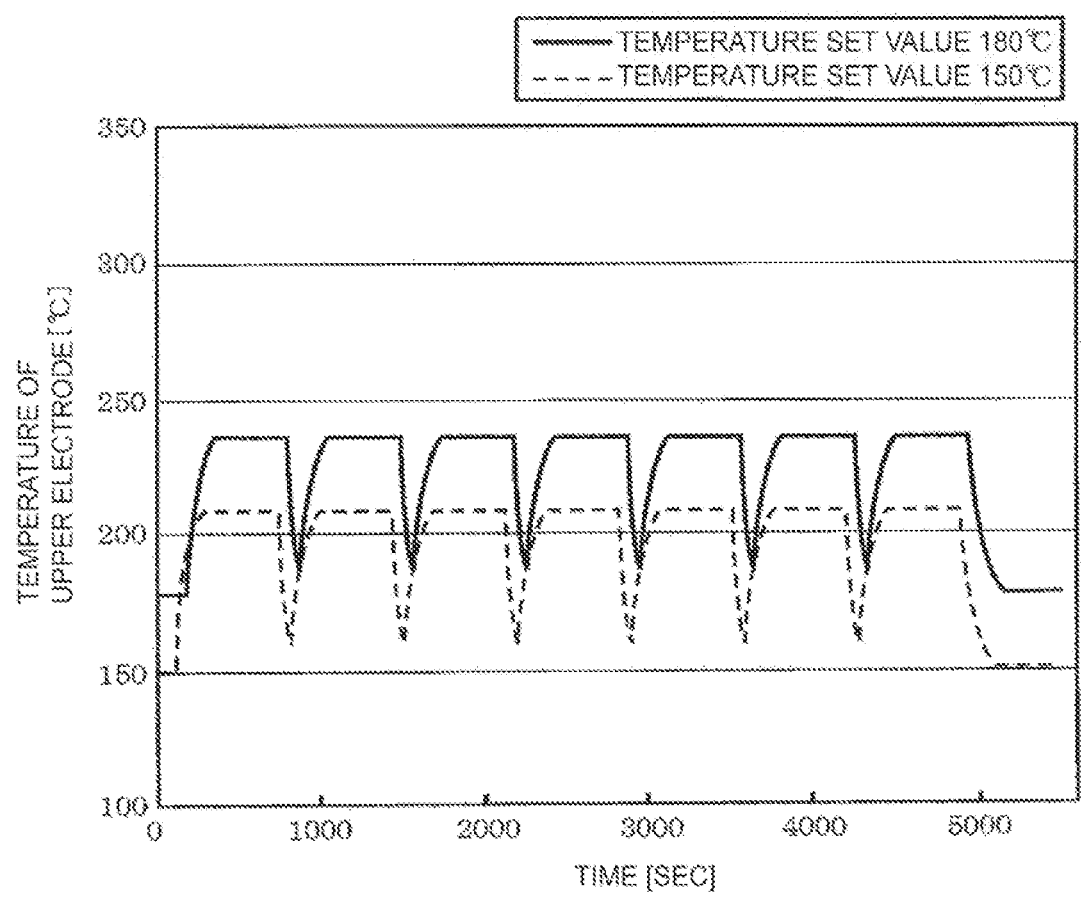
FIG. 10 is an explanatory diagram illustrating the change in temperature of the upper electrode when the temperature set value of the heater is changed.

By the test results as shown in FIG. 8 to FIG. 10, it could be seen that as the application time of the high-frequency power to upper electrode 40 increases, when the temperature set value of heater 46 decreased, the temperature increase caused by the consumption of upper electrode 40 is cancelled to suppress the decrease in etching speed.

Second Exemplary Embodiment

The second exemplary embodiment of the present disclosure is a technology that is not limited to compensation of the temperature set value (a supplied power value to the heater) of heater 46 but reviewed by considering how to compensate the processing parameter configuring the recipe of the plasma etching apparatus. First, referring to FIG. 11A, FIG. 11B and FIG. 11C, variation in the processing result of the wafer will be schematically described.

Figure 11A:
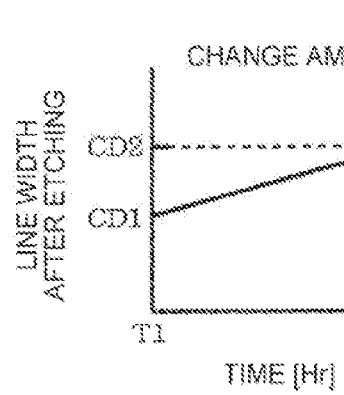
FIG. 11A, FIG. 11B and FIG. 11C each are an explanatory diagram of a background art according to a second exemplary embodiment.

By considering a line width after etching in the case where an etched layer of wafer W with a resist mask is etched, the line width after etching may tend to be thicker from CD1 to CD2 as shown in FIG. 11A as a used time (process time) elapsed after cleaning the plasma etching apparatus at, for example, a time T1.

The plasma etching executed at the time T1 immediately after the cleaning as shown in FIG. 11A will be described in more detail. The line width gradually becomes thicker as shown in FIG. 11B with the increase in the number of processing sheets of wafers W even within the same lot, and as a result, the line width tends to be saturated with a thickness of CD3.

Figure 11B:
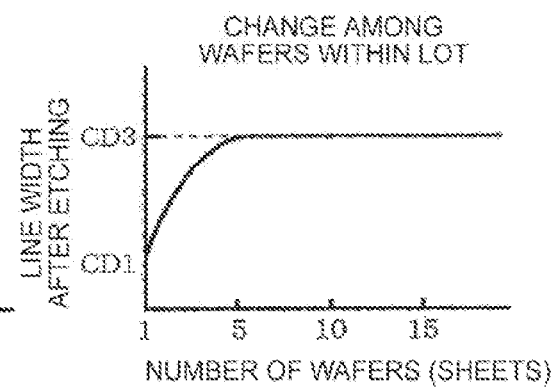
Figure 11C:
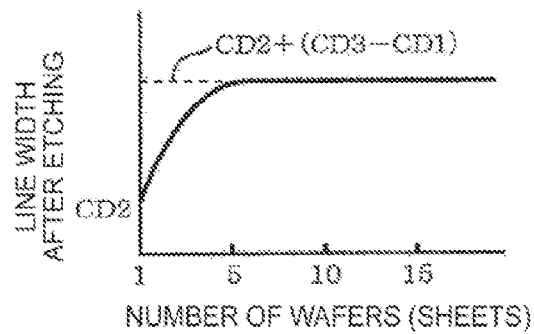

As such, when the change in line width between the lots (FIG. 11A) and the change in line width among wafers W within the same lot (FIG. 11B) occur depending on the used time of the plasma etching apparatus, the change in line width after etching at the time when a time T2 elapsed after the cleaning is shown in FIG. 11C. In this case, the line width at the time of starting the corresponding lot is CD2 and the line width gradually becomes thicker, and as a result, the line width is saturated with a line of CD2+(CD3−CD1).

Herein, the examples as shown in FIGS. 11A to 11C are schematically expressed in order to easily understand a background art according to the second exemplary embodiment and are not described according to an actual characteristic. However, it is understood that the processing result is changed among the lots with the used time of the plasma etching apparatus elapsed and two types of changes having different time scales in which the processing result is changed among wafers W within each lot even in other control items such as the etching speed than the line width of the etching.

Figure 12:
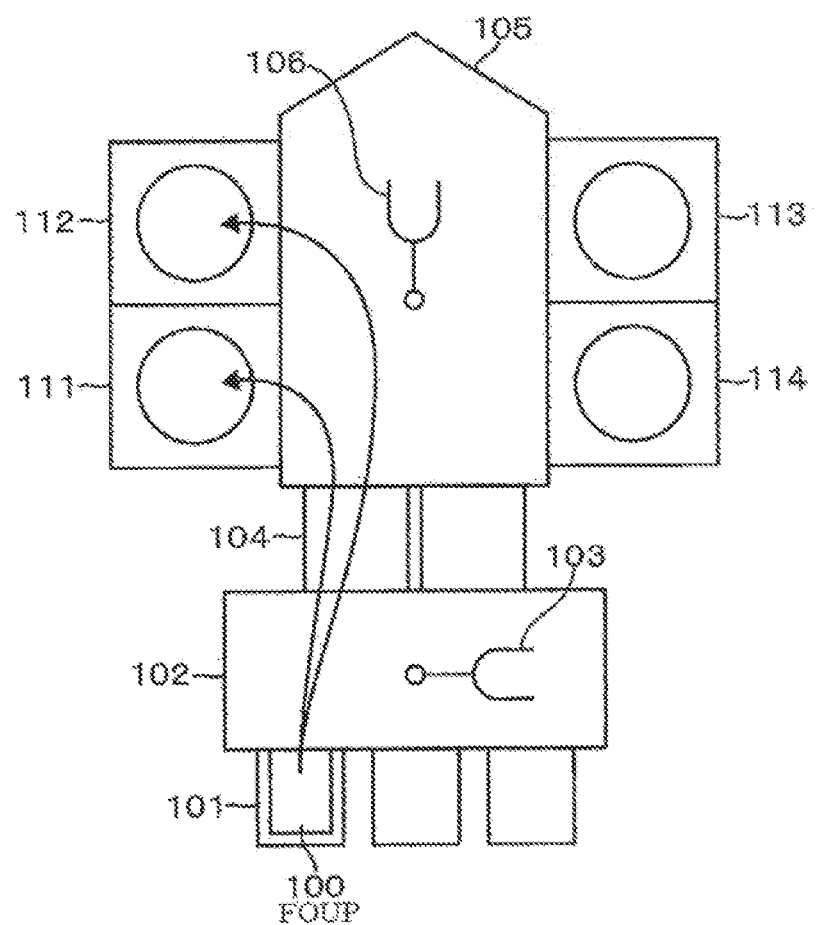
FIG. 12 is a plan view of a plasma etching apparatus according to the second exemplary embodiment.

Therefore, a technology for making the processing result among the lots and wafers W within the same lot constant (suppressing the variation) will be described by using a system of FIG. 12 as an example. The plasma processing apparatus of FIG. 12 is an example of a multi-chamber type plasma etching apparatus that extracts wafer W from a FOUP 100 on placing table 101 and transports and processes wafer W to each of plasma etching units 111 to 114 connected to corresponding vacuum transportation chamber 105 through a load lock module 104 and a vacuum transportation chamber 105 by using a transportation arm 103 installed within a loader module 102.

Each of plasma etching units 111 to 114 is configured as the parallel flat-panel type plasma etching unit according to the first exemplary embodiment as shown in FIG. 1, and may etch wafer W independently. Reference numeral 106 as shown in FIG. 12 is the transportation arm installed within vacuum transportation chamber 105.

A case in which wafer W for one lot extracted from FOUP 100 is carried into two plasma etching units 111 and 112, and plasma-etched concurrently in the multi-chamber type plasma etching apparatus having the above configuration will be described. For example, 25 slots capable of holding each one of 25 wafers W are formed in FOUP 100, and slot numbers 1 to 25 are allocated to the slots in sequence from the top.

Since an etching process is performed in parallel in plasma etching units 111 and 112, wafers W of odd-numbered slots of Nos. 1, 3, 5, . . . are carried into plasma etching unit 111 and wafers W of even-numbered slots of Nos. 2, 4, 6, . . . are carried into plasma etching unit 112.

Figure 13:
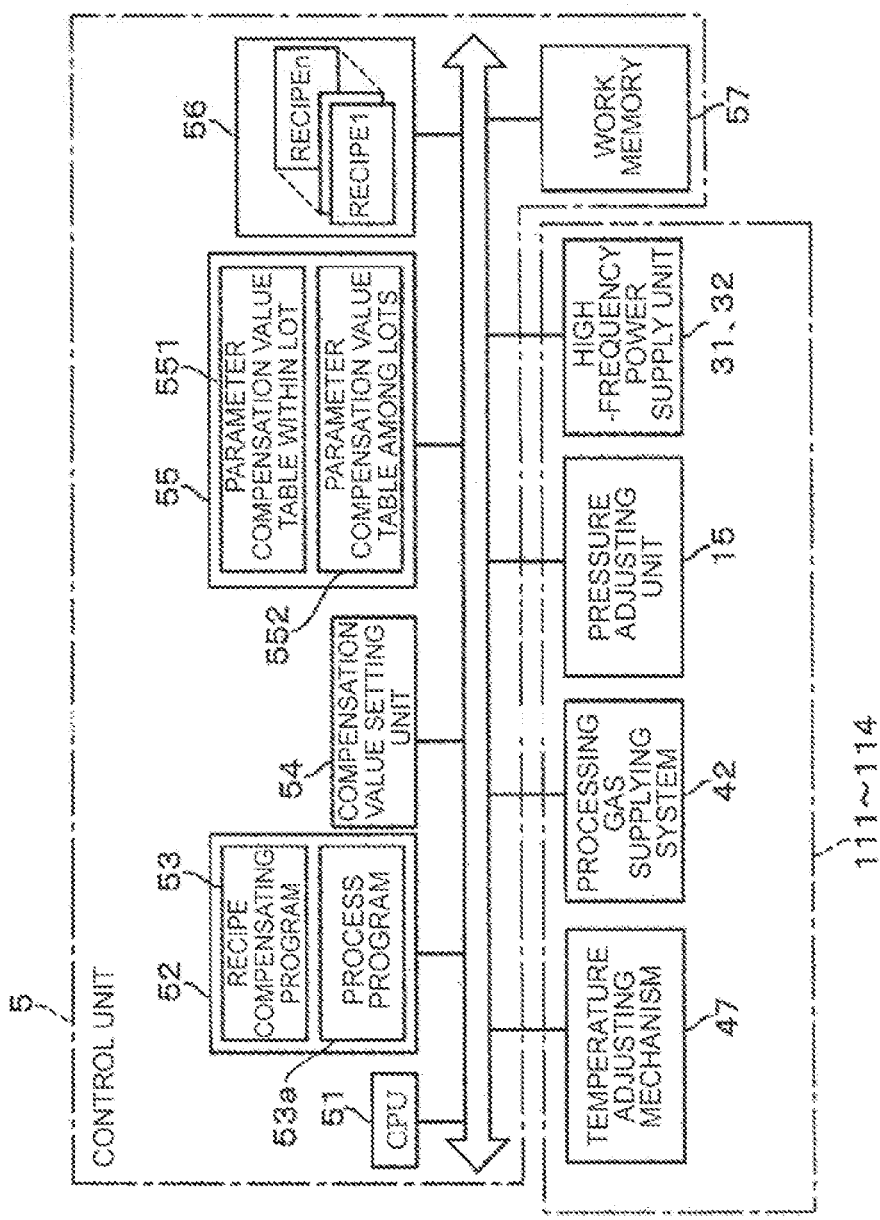
FIG. 13 is a block diagram illustrating an electrical configuration of a plasma etching apparatus according to the second exemplary embodiment.

FIG. 13 illustrates an electrical configuration of the plasma etching apparatus performing the processing. In the figure, the same reference numerals as the reference numerals as shown in FIG. 2 refer to common constituent elements to the plasma etching apparatus according to the first exemplary embodiment. The plasma etching apparatus according to the second exemplary embodiment is different from that of the first exemplary embodiment in that storage unit 55 includes two types of parameter compensation value tables 551 and 552 of parameter compensation value table 552 for compensating the parameters among a plurality of lots and parameter compensation value table 551 for compensating the parameters among wafers W within the same lot.

Compensation values for processing parameters for first and second wafers W within the same lot are stored in parameter compensation value table 551 for compensating the parameters within the same lot between parameter compensation value tables 551 and 552 like the compensation value table as shown in FIG. 4 which is the first exemplary embodiment. However, the second exemplary embodiment is different from the first exemplary embodiment in that a common compensation value is adopted among the lots.

Herein, parameter compensation value table 551 within the lot is set to each of plasma etching units 111, 112. As a result, first, second, third, . . . compensation values of parameter compensation value table 551 of plasma etching unit 111 are used with respect to wafers W of the odd-numbered slots of Nos. 1, 3, 5, . . . of FOUP 100. First, second, third, . . . compensation values of parameter compensation value table 551 of plasma etching unit 112 are used with respect to wafers W of the even-numbered slots of Nos. 2, 4, 6, . . . of FOUP 100.

Herein, when 25 sheets of wafers W are included in one lot, wafers W of odd-numbered slots are carried into plasma etching unit 112 in a next lot and wafers W of even-numbered slots are carried into plasma etching unit 111. In accordance therewith, parameter compensation value table 551 of plasma etching unit 112 is used when wafers W of odd-numbered slots are processed in next FOUP 100 and parameter compensation value table 551 of plasma etching unit 111 is used when wafers W of even-numbered slots are processed.

Meanwhile, in compensation value table 552 among the lots, for example, after cleaning, wafer W that is first processed is set as the first one and a compensation value for the number of processed sheets of wafers W of accumulation of the plurality of lots is set, as shown in FIG. 14. For example, in the example as shown in FIG. 14, the compensation value of each processing parameter is set every the number of sheets of wafers W of accumulation that are carried into each of plasma etching units 111, 112, for example, 100 sheets. The compensation value is set for each of plasma etching units 111, 112 even in regard to compensation value table 552 among the corresponding lots.

As such, control unit 5 adds the compensation value of each of compensation value table 551 within the lot and compensation value table 552 among the lots with respect to the processing parameter of the selected recipe within recipe storing unit 56 based on a set-up of recipe compensating program 53 within program storing unit 52. Therefore, the execution recipe is generated for each of plasma etching units 111 and 112 to be written in work memory 57.

Each of plasma etching units 111, 112 executes plasma etching based on the processing parameter read from the execution recipe. The execution is performed by a process program 53a within program storing unit 52. Variations between wafers W among the lots and within the lots are suppressed, which are described with reference to FIGS. 11A to 11C, by generating a new execution recipe whenever the lot is switched, thereby maintaining the processing result constantly.

Herein, the example of switching the compensation value based on the number of sheets of wafers W has been described in parameter compensation value tables 551, 552 as shown in FIG. 4 or 14, but the compensation value may be switched based on other time references. For example, in parameter compensation value table 551 among the lots, the compensation value may be switched based on the number of accumulated lots which are processed, and the compensation value may be switched based on an accumulation time when plasma processing is performed, such as the application time of the high-frequency power. The compensation value may be switched based on the elapsed time after starting the processing or the accumulation value of the application time of the high-frequency power even in regard to compensation table 552 within the lot.

The example of performing only the compensation among the lots with respect to upper electrode 40 has been described in the first exemplary embodiment, but compensation of changing the compensation value within the same lot may be performed by applying the second exemplary embodiment to the example.

The technology of the second exemplary embodiment may be applied to a serial type plasma etching apparatus as well in which other plasma etching units 111 to 114 consecutively perform etching so that in the multi-chamber type plasma etching apparatus as shown in FIG. 12, for example, plasma etching unit 111 performs plasma etching of steps S1 to S3 and performs plasma etching of steps S4 to S6 by transporting wafer W to plasma etching unit 112.

The compensation method of the processing parameter according to the second exemplary embodiment is not limited to various plasma processing apparatuses such as the plasma etching apparatus, a plasma CVD apparatus and a plasma ashing apparatus. The compensation method may be applied to even an application and development apparatus or a vertical heat processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A parallel flat-panel type plasma processing apparatus comprising:
    a processing chamber provided with a first electrode and a second electrode where a placing table serves as the first electrode configured to place a substrate, and a high-frequency power is applied between the first and second electrodes to convert a processing gas into plasma thereby performing a plasma processing for the substrate;
    a temperature adjusting mechanism configured to adjust a temperature of the second electrode;
    a temperature setting unit configured to set the temperature of the second electrode in the plasma processing;
    a set temperature compensating unit configured to compensate the set temperature of the second electrode to become lower than the set temperature of the second electrode according to a used time elapsed after starting using a new second electrode; and
    a temperature controlling unit programmed to output a control signal for controlling the temperature adjusting mechanism based on the set temperature of the second electrode set by the temperature setting unit and the compensated temperature of the second electrode compensated by the set temperature compensating unit.

2. The parallel flat-panel type plasma processing apparatus of claim 1, wherein the set temperature compensating unit includes a storage unit configured to store compensation data acquired by associating a compensation value of the set temperature of the second electrode with an accumulation time of the plasma processing or the number of processed substrates after starting using a new second electrode, and is configured to read the compensation value of the set temperature depending on the accumulation time of the plasma processing or the number of processed substrates from the storage unit to compensate the set temperature set in the temperature setting unit.

3. The parallel flat-panel type plasma processing apparatus of claim 1, wherein the set temperature compensating unit includes an input screen for inputting the compensation value of the set temperature of the second electrode with the accumulation time of the plasma processing or the number of processed substrates after starting using a second electrode.

4. A parallel flat-panel type plasma processing apparatus comprising:
    a processing chamber provided with a first electrode and a second electrode where the first electrode serves as a placing table of a substrate as well;
    a gas supply unit configured to supply a processing gas to the processing chamber;
    a power source configured to supply a high-frequency power between the first and second electrodes to convert the processing gas supplied therein into plasma thereby performing a plasma processing for the substrate where the second electrode is set to a first temperature;
    a storage unit configured to store a target temperature which is lower than the first temperature acquired in advance by associating with an accumulated time of the plasma processing or the number of processed substrates after start using the second electrode; and
    a temperature controller programmed to read the target temperature from the storage unit while the substrate is being processed with the plasma processing and adjust the second electrode to the target temperature while the substrate is being processed with the plasma processing.

5. The parallel flat-panel type plasma processing apparatus of claim 4, wherein the temperature controller includes an input device configured to manually input the target temperature of the second electrode with the accumulated time of the plasma processing or the number of processed substrates after start using the second electrode.

* * * * *